United States Patent
Wu et al.

(10) Patent No.: US 11,513,897 B2
(45) Date of Patent: Nov. 29, 2022

(54) ERROR CORRECTION ON LENGTH-COMPATIBLE POLAR CODES FOR MEMORY SYSTEMS

(71) Applicant: Samsung Electronics Co., Ltd., Suwon-si (KR)

(72) Inventors: Wei Wu, San Diego, CA (US); Rekha Pitchumani, Oak Hill, VA (US); Zongwang Li, Dublin, CA (US)

(73) Assignee: SAMSUNG ELECTRONICS CO., LTD.

( * ) Notice: Subject to any disclaimer, the term of this patent is extended or adjusted under 35 U.S.C. 154(b) by 0 days.

(21) Appl. No.: 17/203,745

(22) Filed: Mar. 16, 2021

(65) Prior Publication Data

US 2022/0206895 A1 Jun. 30, 2022

Related U.S. Application Data

(60) Provisional application No. 63/131,308, filed on Dec. 28, 2020.

(51) Int. Cl.
| | | |
|---|---|---|
| *G06F 11/10* | (2006.01) | |
| *G06F 11/00* | (2006.01) | |
| *H03M 13/13* | (2006.01) | |
| *G06F 17/16* | (2006.01) | |

(52) U.S. Cl.
CPC .......... *G06F 11/1076* (2013.01); *G06F 17/16* (2013.01); *H03M 13/13* (2013.01)

(58) Field of Classification Search
CPC ..... G06F 11/1076; G06F 17/16; H03M 13/13
See application file for complete search history.

(56) References Cited

U.S. PATENT DOCUMENTS

| | | | |
|---|---|---|---|
| 9,203,525 B2 | 12/2015 | Shen et al. | |
| 10,211,952 B2* | 2/2019 | Jang | H04L 25/03254 |
| 10,644,836 B2 | 5/2020 | Kudekar et al. | |
| 10,651,973 B2 | 5/2020 | Ge et al. | |
| 10,749,633 B2* | 8/2020 | Xu | H04L 1/0054 |
| 11,057,053 B2* | 7/2021 | Gross | H03M 13/1131 |
| 2019/0245650 A1 | 8/2019 | Hui et al. | |
| 2020/0153459 A1 | 5/2020 | Wang et al. | |
| 2020/0322085 A1 | 10/2020 | Kudekar et al. | |

* cited by examiner

*Primary Examiner* — Justin R Knapp
(74) *Attorney, Agent, or Firm* — Renaissance IP Law Group LLP

(57) ABSTRACT

Inventive aspects include a polar code encoding system, which includes a partitioning unit to receive and partition input data into partitioned input data units. Encoders encode the partitioned input data units, and generate encoded partitioned input data units. Multiplier units perform matrix multiplication on the partitioned input data units and generator matrices, and generate matrix products. Adder units perform matrix addition on the encoded partitioned input data units and the matrix products. A combining unit combines outputs of the encoders into a target code word X. The target code word X may be a length-N code word X, where $N=N_1+N_2+\ldots+N_m$, where each of $N_1$, $N_2$, through $N_m$ are a power of two (2).

20 Claims, 11 Drawing Sheets

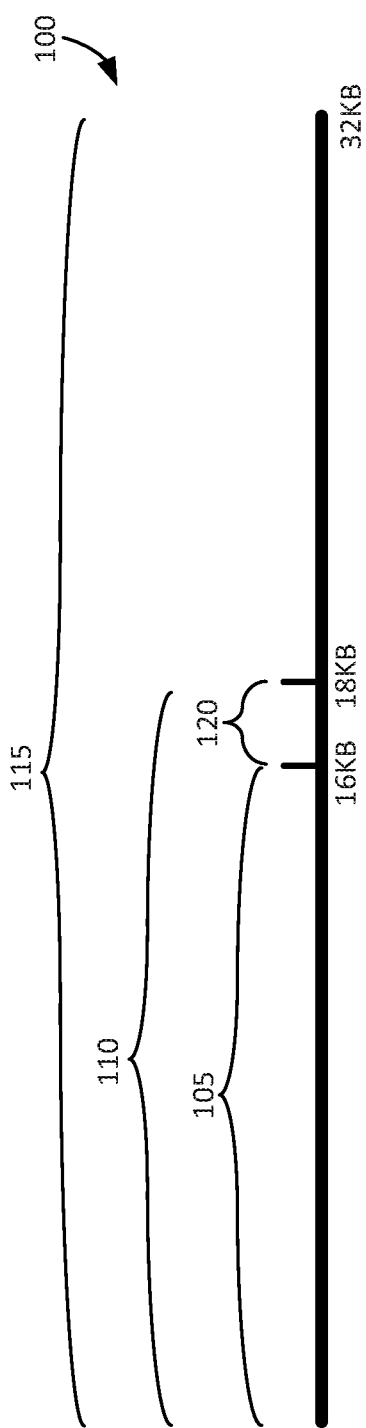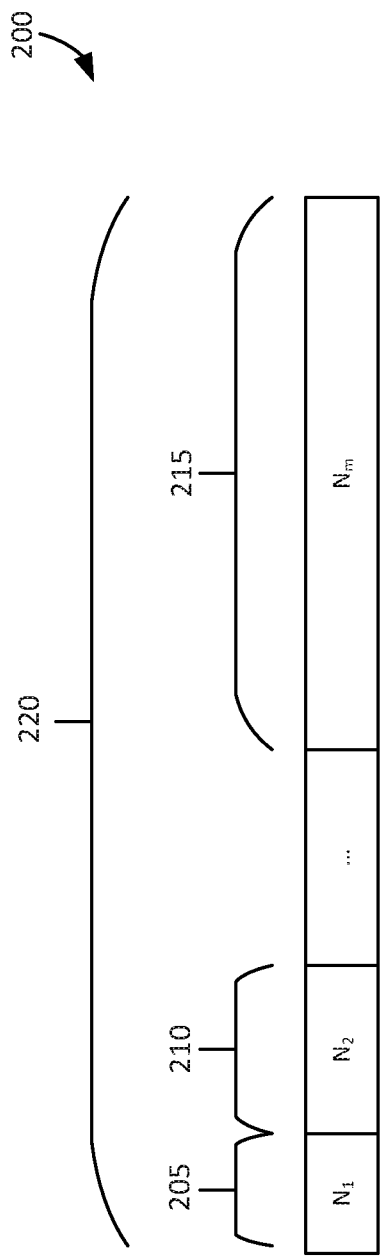

ERROR CORRECTION ON LENGTH-COMPATIBLE POLAR CODES FOR MEMORY SYSTEMS

RELATED APPLICATION DATA

This application claims the benefit of U.S. Provisional Application Ser. No. 63/131,308, filed on Dec. 28, 2020, which is hereby incorporated by reference.

TECHNICAL AREA

This disclosure relates to computer memory systems, and more particularly, to error correction on length-compatible polar codes for memory systems.

BACKGROUND

Polar codes may be used for error-correction in computer memory systems. A memory device such as a NAND flash device may store data having a particular length. In addition to the data, parity information may be stored. The total length of the data and the parity may not be a power of two (2). Some approaches to constructing length-compatible polar codes include puncturing and shortening, but such approaches result in higher complexity, poorer error correction performance, or both.

BRIEF SUMMARY

Inventive aspects include a polar code encoding system, which includes a partitioning unit to receive and partition input data into partitioned input data units. Encoder encode the partitioned input data units, and generate encoded partitioned input data units. Multiplier units perform matrix multiplication on the partitioned input data units and generator matrices, and generate matrix products. Adder units perform matrix addition on the encoded partitioned input data units and the matrix products. A combining unit combines outputs of the encoders into a target code word X. The target code word X may be a length-N code word X, where $N=N_1+N_2+\ldots+N_m$, where each of $N_1$, $N_2$, through $N_m$ are a power of two (2).

Some embodiments include a method for performing error correction on length-compatible polar codes for memory systems. The method may include constructing a coupled code matrix structure including two or more G matrices of increasing size arranged diagonally. The method may include obtaining a generator matrix $P_{ij}$ of a target code word X using the coupled code matrix structure. The method may include dividing input data into a first partitioned input data unit and a second partitioned input data unit. The method may include encoding, by an encoder, the first partitioned input data unit to generate a first encoded partitioned input data unit. The method may include performing, by a multiplier unit, a matrix multiplication on the generator matrix $P_{ij}$ and the second partitioned input data unit, to generate a product matrix. The method may include performing, by an adder unit, a matrix addition on the product matrix and the first encoded partitioned input data unit.

Some embodiments include a method for performing error correction on length-compatible polar codes for memory systems. The method may include receiving, by a partitioning unit, input data. The method may include partitioning the input data, by the partitioning unit, into a first partitioned input data unit and a second partitioned input data unit. The method may include encoding, by an encoder, the first partitioned input data unit. The method may include generating, by the encoder, an encoded partitioned input data unit. The method may include performing matrix multiplication, by a multiplier unit, on the second partitioned input data unit and a generator matrix. The method may include generating, by the multiplier unit, a matrix product. The method may include performing, by an adder unit, matrix addition on the encoded partitioned input data unit and the matrix product.

BRIEF DESCRIPTION OF THE DRAWINGS

The foregoing and additional features and advantages of the present inventive principles will become more readily apparent from the following detailed description, made with reference to the accompanying figures, in which:

FIG. 1 shows an example diagram of a length of an ECC code word including data and parity information, in accordance with example embodiments of the disclosure.

FIG. 2 shows an example diagram of a polar code encoding structure divided into multiple polar codes in accordance with example embodiments of the disclosure.

DETAILED DESCRIPTION

Figure 3:
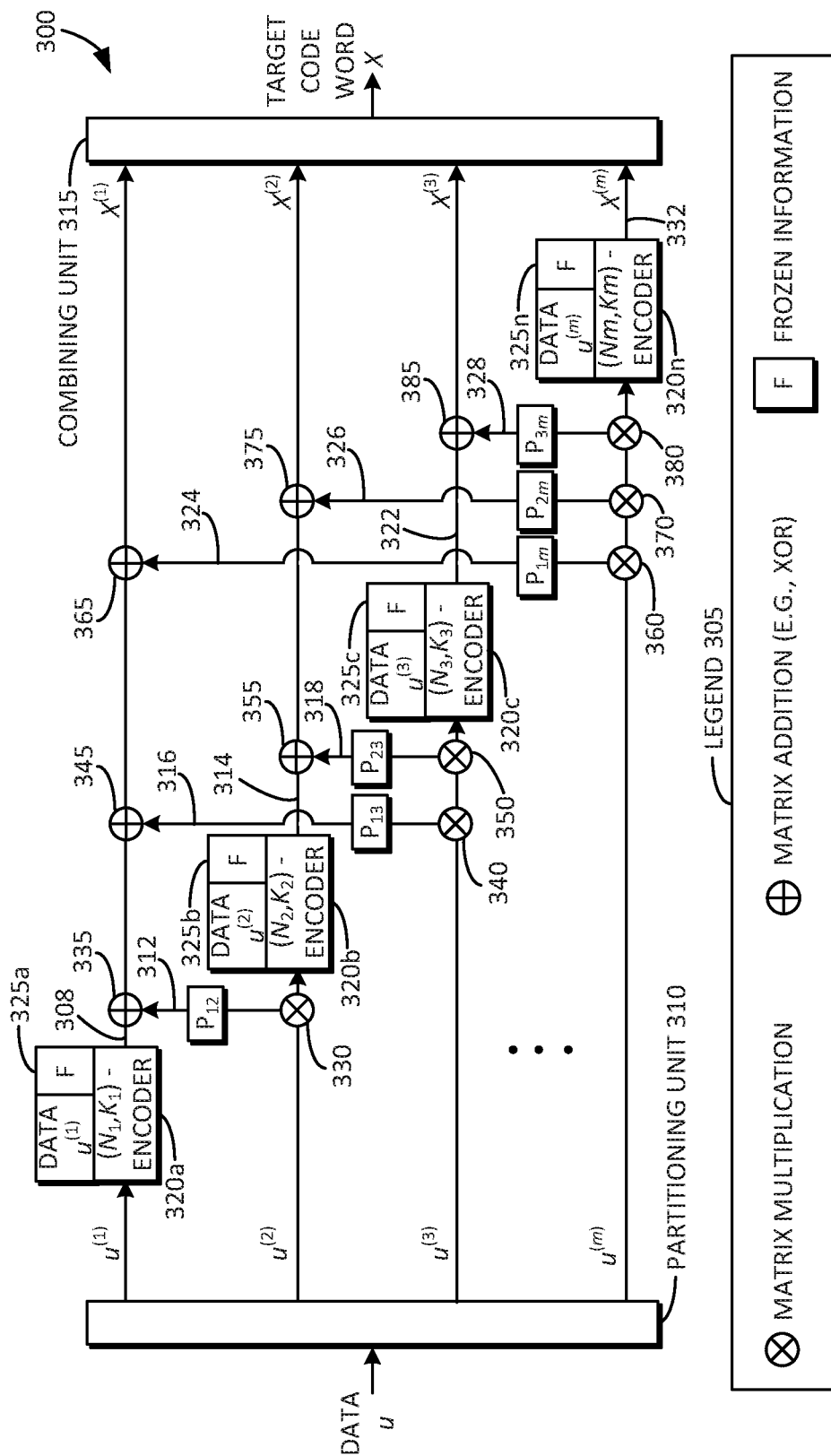
FIG. 3 shows an example diagram of a polar code encoding structure including a generator matrix of a target code word in accordance with example embodiments of the disclosure.

Reference will now be made in detail to embodiments disclosed herein, examples of which are illustrated in the accompanying drawings. In the following detailed description, numerous specific details are set forth to enable a thorough understanding of the inventive concept. It should be understood, however, that persons having ordinary skill in the art may practice the inventive concept without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first code could be termed a second code, and, similarly, a second code could be termed a first code, without departing from the scope of the inventive concept.

The terminology used in the description of the inventive concept herein is for the purpose of describing particular embodiments only and is not intended to be limiting of the inventive concept. As used in the description of the inventive concept and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

Polar codes may be capacity-achieving on binary symmetric memoryless channels with low complexity encoders and decoders. The complexity may be O(N log N), where N is code length. However, standard polar codes may have a restriction in code length, where only a power of two (2) may be allowed. Memory system error-correcting code (ECC) sizes may typically not be powers of two (2). For example, data (e.g., 16 Kilobytes (KB) in length) plus parity (e.g., 2 KB in length) may equal an ECC code word, e.g., 18 KB in length, which is not a power of two (2). A length E of the target code word X may be slightly larger than N, which is a power of 2. Some approaches to constructing length-compatible polar codes may include 1) rate-matching schemes (e.g., puncturing and shortening), in which part of code word is not transmitted or stored, and 2) multi-kernel construction.

In rate-matching schemes, there may be high decoding complexity in which a decoder on a mother polar code has a length that may be larger than that of a target code word. For example, if the target code word length is 18 KB, then the decoder may be performed on the mother polar code with a length of 32 KB. In a worst case, the complexity using rate-matching schemes may increase the complexity by twice. In multi-kernel construction, a decoder may be implemented on large kernels with different sizes. Efficient decoding algorithms for large kernels may be intractable because of high complexity.

Instead of modifying a long mother code using schemes such as puncturing or shortening, embodiments disclosed herein may construct length-compatible polar codes by coupling two or more relatively shorter polar codes together. This approach can construct a polar code with target length N, which may be a summation of two or more relatively shorter polar codes each having a length of a power of two (2). Information may be coupled between independent encoders with relatively short lengths to improve coding reliability. A polar code encoding system disclosed herein partitions input data, which may then be encoded. Generator matrices may be derived from a coupled code matrix structure. Multiplier units may perform matrix multiplication on the encoded partitioned input data units and generator matrices. Adder units perform matrix addition, and a combining unit combines outputs of the encoders into a target code word. The target code word X may be a length-compatible code word.

FIG. 1 shows an example diagram 100 of an ECC code word 110 including data 105 having a length of 16 KB, and parity information 120 having a length of 2 KB, for a total length of 18 KB in accordance with example embodiments of the disclosure. In this example, a mother code 115 has a length of 32 KB. Rather than using schemes such as puncturing or shortening, embodiments disclosed herein may construct length-compatible polar codes by coupling two or more relatively shorter polar codes together each having a length of a power of two (2), as further described below.

FIG. 2 shows an example diagram of a polar code encoding structure 200 divided into multiple polar codes (e.g., 205, 210, 215) in accordance with example embodiments of the disclosure. Two or more relatively shorter polar codes (e.g., 205, 210) having a length of a power of two (2) can be coupled together with improved reliability, and lower decoding complexity. The polar code 205 can have a length $N_1$, which is a power of two (2). The polar code 210 can have a length $N_2$, which is a power of two (2). The polar code 215 can have a length $N_m$, which is a power of two (2). The polar code 220 can have a length $N=N_1+N_2 \ldots +N_m$, which is coupled with m short polar codes 205, 210, ..., 215 with length $N_i$, where i=1, 2, ..., m of a power of two (2). Accordingly, two or more of the polar codes (e.g., 205, 210, 215) can be combined in a multilevel fashion, as further described below.

FIG. 3 shows an example diagram of a polar code encoding structure 300 including a generator matrix (e.g., $P_{12}, P_{13}, P_{23}, P_{1m}, P_{2m}, P_{3m}$, etc.) of a target code word X in accordance with example embodiments of the disclosure. The polar code encoding structure 300 may include a partitioning unit 310. The partitioning unit 310 may receive data u, and may partition the data u into partitioned input data units $u^{(1)}, u^{(2)}, u^{(3)}$, through $u^{(m)}$. Each of the partitioned input data units (e.g., $u^{(1)}, u^{(2)}, u^{(3)}$, through $u^{(m)}$) may be referred to as $u^{(i)}$, which may be a length-$K_i$ data sequence, where i=1, 2, ..., m. The polar code encoding structure 300 may include a combining unit 315. The combining unit 315 may combine the partitioned input data units (e.g., $u^{(1)}, u^{(2)}, u^{(3)}$, through $u^{(m)}$) after the partitioned input data units have been encoded by corresponding individual encoders (e.g., 320a, 320b, 320c, through 320n). The combining unit 315 may output combined data x. The combined data x may be equal to a combination of encoded data units $(x^{(1)}|x^{(2)}|x^{(3)}| \ldots |x^{(m)})$, which may form a length-N code word X, where $N=N_1+N_2+ \ldots +N_m$. The encoding structure 300 can be described as a multilevel technique in which $u^{(i)}$ may be a length-$K_i$ data sequence, where i=1, 2, . . . , m, where $x=(x^{(1)}|x^{(2)}|x^{(3)}| \ldots |x^{(m)})$ may be a length-E code word, and where $E=N_1+N_2+ \ldots +N_m$. E may be a length of the target code word X. The value of each of the encoded data units $x^{(i)}$ may be determined as follows:

$$x^{(i)} = u^{(i)}G_i + \Sigma_{j=i+1}^{m} u^{(j)} P_{ij}.$$

The encoder 320a may receive and encode the partitioned data unit $u^{(1)}$. The encoder 320a may determine that some information 325a on this position should be frozen, i.e., not transferred. A matrix multiplier unit 330 may receive the partitioned data unit $u^{(2)}$ and may perform a matrix multiplication operation on the partitioned data unit $u^{(2)}$ with the generator matrix $P_{12}$ of the target code word X. A matrix adder unit 335 may receive a result of the matrix multiplication performed by the matrix multiplier unit 330, and add the result to an output of the encoder 320a. For example, the matrix adder unit 335 may perform an exclusive-or (XOR) operation on the result of the matrix multiplication performed by the matrix multiplier unit 330 with the output of the encoder 320a. A legend 305 correlates symbols used in FIG. 3 with their functions of matrix multiplication, matrix addition, and frozen information.

The encoder 320b may receive and encode the partitioned data unit $u^{(2)}$. The encoder 320b may determine that some information 325b on this position should be frozen, i.e., not transferred. A matrix multiplier unit 340 may receive the partitioned data unit $u^{(3)}$ and may perform a matrix multiplication operation on the partitioned data unit $u^{(3)}$ with the generator matrix $P_{13}$ of the target code word X. A matrix adder unit 345 may receive a result of the matrix multiplication performed by the matrix multiplier unit 340, and add the result to an output of the matrix adder unit 335. For example, the matrix adder unit 345 may perform an exclusive-or (XOR) operation on the result of the matrix multiplication performed by the matrix multiplier unit 340 with the output of the matrix adder unit 335.

A matrix multiplier unit 350 may receive the partitioned data unit $u^{(3)}$ and may perform a matrix multiplication operation on the partitioned data unit $u^{(3)}$ with the generator matrix $P_{23}$ of the target code word X. A matrix adder unit 355 may receive a result of the matrix multiplication performed by the matrix multiplier unit 350, and add the result to an output of the encoder 320b. For example, the matrix adder unit 355 may perform an exclusive-or (XOR) operation on the result of the matrix multiplication performed by the matrix multiplier unit 350 with the output of the encoder 320b.

The encoder 320c may receive and encode the partitioned data unit $u^{(3)}$. The encoder 320c may determine that some information 325c on this position should be frozen, i.e., not transferred. A matrix multiplier unit 360 may receive the partitioned data unit $u^{(m)}$ and may perform a matrix multiplication operation on the partitioned data unit $u^{(m)}$ with the generator matrix $P_{1m}$ of the target code word X. A matrix adder unit 365 may receive a result of the matrix multiplication performed by the matrix multiplier unit 360, and add the result to an output of the matrix adder unit 345. For example, the matrix adder unit 365 may perform an exclusive-or (XOR) operation on the result of the matrix multiplication performed by the matrix multiplier unit 360 with the output of the matrix adder unit 345.

A matrix multiplier unit 370 may receive the partitioned data unit $u^{(m)}$ and may perform a matrix multiplication operation on the partitioned data unit $u^{(m)}$ with the generator matrix $P_{2m}$ of the target code word X. A matrix adder unit 375 may receive a result of the matrix multiplication performed by the matrix multiplier unit 370, and add the result to an output of the matrix adder unit 355. For example, the matrix adder unit 375 may perform an exclusive-or (XOR) operation on the result of the matrix multiplication performed by the matrix multiplier unit 370 with the output of the matrix adder unit 355.

A matrix multiplier unit 380 may receive the partitioned data unit $u^{(m)}$ and may perform a matrix multiplication operation on the partitioned data unit $u^{(m)}$ with the generator matrix $P_{am}$ of the target code word X. A matrix adder unit 385 may receive a result of the matrix multiplication performed by the matrix multiplier unit 380, and add the result to an output of the encoder 320c. For example, the matrix adder unit 385 may perform an exclusive-or (XOR) operation on the result of the matrix multiplication performed by the matrix multiplier unit 380 with the output of the encoder 320c. The encoder 320n may receive and encode the partitioned data unit $u^{(m)}$. The encoder 320n may determine that some information 325n on this position should be frozen, i.e., not transferred.

The encoders (e.g., 320a, 320b, 320c, through 320n) together with the matrix addition and matrix multiplication may generate the encoded data units $x^{(1)}$, $x^{(2)}$, $x^{(3)}$, through $x^{(m)}$. The combined data x may be equal to a combination of the encoded data units $x^{(1)}$, $x^{(2)}$, $x^{(3)}$, through $x^{(m)}$, which may form a length-u code word (e.g., 110), where $N=N_1+N_2+ \ldots +N_m$. The subsequent decoding complexity, as further described below, may about half of the complexity of rate-matching schemes. The encoders (e.g., 320a, 320b, 320c, through 320n) may also provide improved reliability.

More specifically, a polar code encoding system 300 may include the partitioning unit 310, which may receive the input data u, and may partition the input data u into a partitioned input data unit $u^{(1)}$, a partitioned input data unit $u^{(2)}$, a partitioned input data unit $u^{(3)}$, through a partitioned input data unit $u^{(m)}$. It will be understood that the partitioning unit 310 may partition the input data u into any suitable number of partitioned input data units.

The polar code encoding system 300 may include the encoder 320a, which may encode the partitioned input data unit $u^{(1)}$, and may generate a first encoded partitioned input data unit 308. The polar code encoding system 300 may include the multiplier unit 330, which may perform matrix multiplication on the partitioned input data unit $u^{(2)}$ and the generator matrix $P_{12}$, and may generate a matrix product 312. The polar code encoding system 300 may include the adder unit 335, which may perform matrix addition (e.g., XOR) on the encoded partitioned input data unit 308 and the matrix product 312.

The polar code encoding system 300 may include the encoder 320b, which may encode the partitioned input data unit $u^{(2)}$, and may generate an encoded partitioned input data unit 314. The polar code encoding system 300 may include the multiplier unit 340, which may perform matrix multiplication on the partitioned input data unit $u^{(3)}$ and the generator matrix $P_{13}$, and may generate a matrix product 316. The polar code encoding system 300 may include the adder unit 345, which may perform matrix addition on the encoded partitioned input data unit 308 and the matrix product 316. It will be understood that the adder unit 345 may perform matrix addition on an output of the adder unit 335 and the matrix product 316.

The polar code encoding system 300 may include the multiplier unit 350, which may perform matrix multiplication on the partitioned input data unit $u^{(3)}$ and the generator matrix $P_{23}$, and may generate a matrix product 318. The polar code encoding system 300 may include the adder unit 355, which may perform matrix addition on the encoded partitioned input data unit 314 and the matrix product 318.

The polar code encoding system 300 may include the encoder 320c, which may encode the partitioned input data unit $u^{(3)}$, and may generate an encoded partitioned input data unit 322. The polar code encoding system 300 may include the multiplier unit 360, which may perform matrix multiplication on an mth partitioned input data unit $u^{(m)}$ and a generator matrix $P_{1m}$, and may generate a matrix product 324. The polar code encoding system 300 may include the adder unit 365, which may perform matrix addition on the encoded partitioned input data unit 308 and the matrix product 324. It will be understood that the adder unit 365 may perform matrix addition on an output of the adder unit 345 and the matrix product 324.

The polar code encoding system 300 may include the multiplier unit 370, which may perform matrix multiplication on the mth partitioned input data unit $u^{(m)}$ and a generator matrix $P_{2m}$, and may generate a matrix product 326. The polar code encoding system 300 may include the adder unit 375, which may perform matrix addition on the encoded partitioned input data unit 314 and the matrix product 326. It will be understood that the adder unit 375 may perform matrix addition on an output of the adder unit 355 and the matrix product 326.

The polar code encoding system 300 may include the multiplier unit 380, which may perform matrix multiplication on the mth partitioned input data unit $u^{(m)}$ and a generator matrix $P_{3m}$, and may generate a matrix product 328. The polar code encoding system 300 may include the adder unit 385, which may perform matrix addition on the encoded partitioned input data unit 322 and the matrix product 328.

The polar code encoding system 300 may include the nth encoder 320n, which may encode the mth partitioned input data unit $u^{(m)}$, and may generate an mth encoded partitioned input data unit 332. The polar code encoding system 300 may include the combining unit 315, which may combine outputs of the encoder 320a, the encoder 320b, the encoder 320c, and the nth encoder 320n into the target code word X. The target code word X may be a length-N code word X, where $N=N_1+N_2+ \ldots +N_m$, where each of $N_1$, $N_2$, through $N_m$ are a power of two (2). The generator matrices (e.g., $P_{12}$, $P_{13}$, $P_{23}$, $P_{1m}$, $P_{2m}$, $P_{3m}$, etc.) are each a sub-matrix of the coupled code matrix structure 400 of FIG. 4, which may include two or more G matrices of increasing size arranged diagonally, as further described below.

In some embodiments, the multiplier units 330, 340, 350, 360, 370, and 308 are a single, same multiplier unit. In some embodiments, the adder units 335, 345, 355, 365, 375, and 385 are a single, same adder unit.

Figure 4:
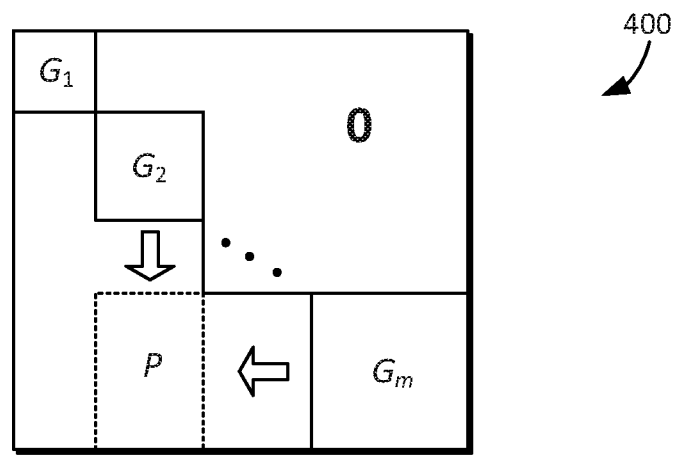
FIG. 4 shows an example diagram of a coupled code matrix structure showing the derivation of the generator matrix of the target code word of FIG. 3 in accordance with example embodiments of the disclosure.
Figures 5A, 5B:
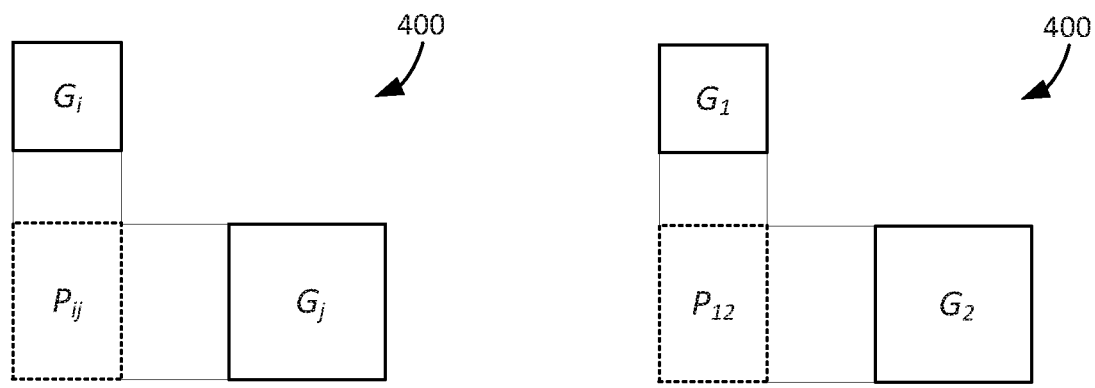
FIG. 5A shows an example diagram of a generalized instance of the coupled code matrix structure showing the derivation of the generator matrix of the target code word of FIG. 3 in accordance with example embodiments of the disclosure.
FIG. 5B shows an example diagram of a specific instance of the coupled code matrix structure showing the derivation of the generator matrix of the target code word of FIG. 3 in accordance with example embodiments of the disclosure.
Figure 6:
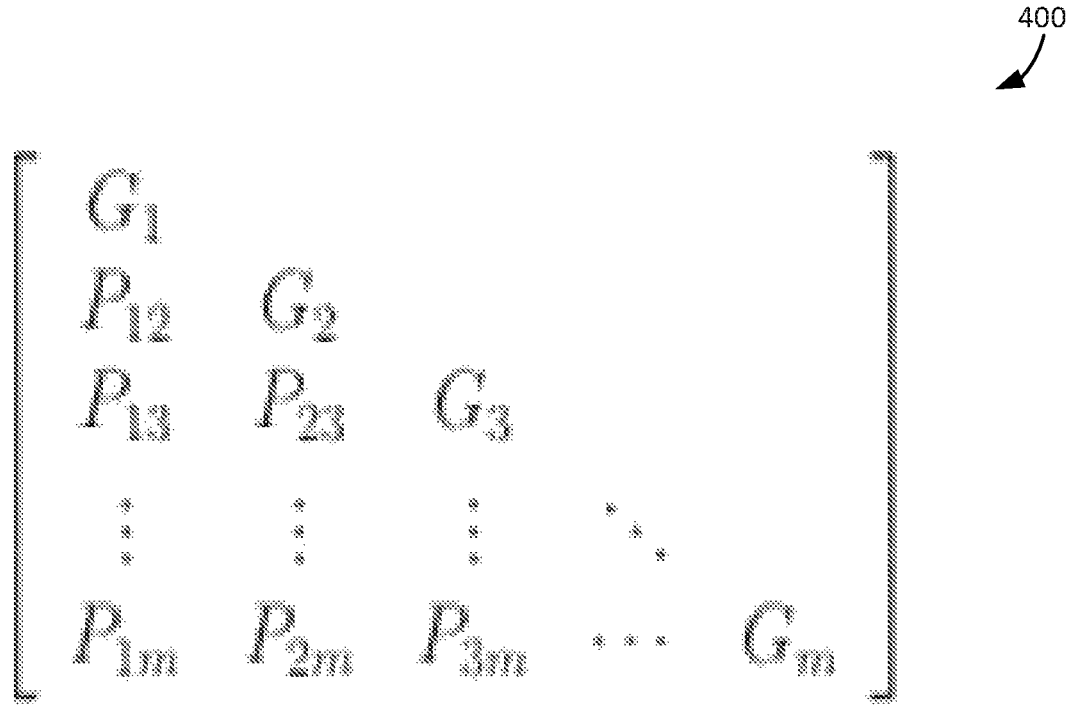
FIG. 6 shows an example diagram of mathematical representation of the coupled code matrix structure of FIG. 4 in accordance with example embodiments of the disclosure.

FIG. 4 shows an example diagram of a coupled code matrix structure 400 showing the derivation of the generator matrix P of the target code word X of FIG. 3 in accordance with example embodiments of the disclosure. FIG. 5A shows an example diagram of a generalized instance of the coupled code matrix structure 400 showing the derivation of the generator matrix $P_{ij}$ of the target code word X of FIG. 3 in accordance with example embodiments of the disclosure. FIG. 5B shows an example diagram of a specific instance of the coupled code matrix structure 400 showing the derivation of the generator matrix $P_{12}$ of the target code word X of FIG. 3 in accordance with example embodiments of the disclosure. FIG. 6 shows an example diagram of mathematical representation of the coupled code matrix structure 400 of FIG. 4 in accordance with example embodiments of the disclosure. Reference is now made to FIGS. 4 through 6.

$G_i$ polar code matrices may be coupled as shown in FIGS. 4 through 6. $G_i$ may be a polar $N_i \times N_i$ matrix structure, where $N_i = 2^{n_i}$, and $$G_i = \begin{bmatrix} 1 & 0 \\ 1 & 1 \end{bmatrix}^{\otimes n_i}.$$

The coupled code matrix structure 400 may include G matrices (e.g., $G_1$, $G_2$, through $G_m$) each having a different size, and arranged in a diagonal configuration, as shown in FIG. 4. The $G_1$ matrix may have a first size. The $G_2$ matrix may have a second size that is greater than the first size, and may be arranged diagonally relative to the $G_1$ matrix. The $G_m$ matrix may have a third size that is greater than the second size, and may be arranged diagonally relative to the $G_2$ matrix, and so forth.

The generator matrix $P_{ij}$ of the target code word X of FIG. 5A may be an $N_j \times N_i$ matrix, which may be a sub-matrix of the $G_j$ matrix. Accordingly, the generator matrix $P_{ij}$ of the target code word X can be obtained by selecting $N_i$ columns from those of the $G_j$ matrix. The generator matrix $P_{ij}$ of the target code word X may be obtained by selecting $N_i$ rows of the $G_i$ polar $N_i \times N_i$ matrix. In the more specific example of FIG. 5B, the generator matrix $P_{12}$ of the target code word X may be obtained by selecting columns from those of the $G_2$ matrix, and/or by selecting rows from those of the $G_1$ matrix.

Mathematically, the coupled code matrix structure 400 can be expressed as shown in FIG. 6. Accordingly, the ECC code word (e.g., 110) may be $x=(x^{(1)}|x^{(2)}|x^{(3)}| \ldots |x^{(m)}$, where $$x^{(i)} = u^{(i)} G_i + \Sigma_{j=i+1}^{m} u^{(j)} P_{ij}.$$

Figure 7:
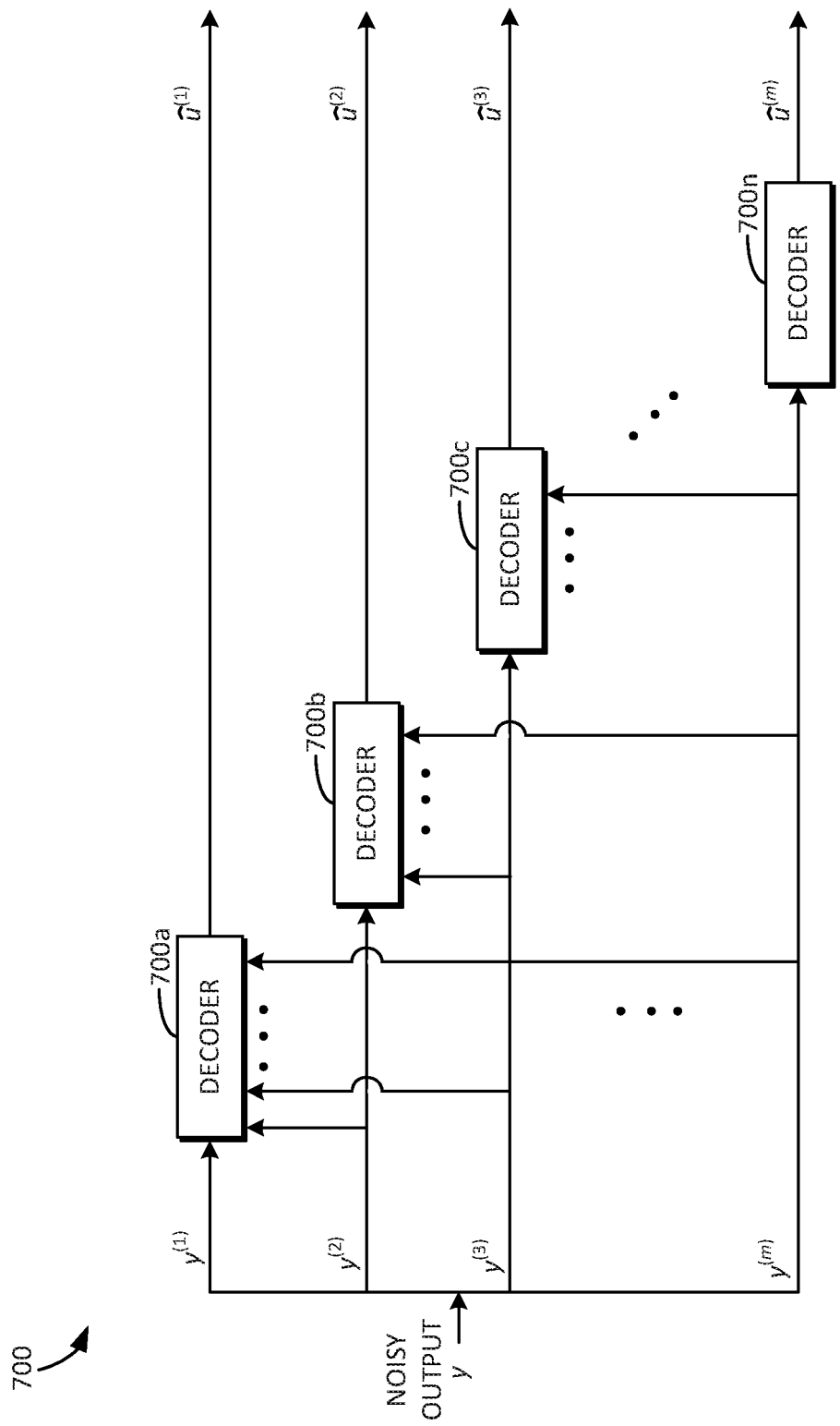
FIG. 7 shows an example block diagram of a polar code decoding structure in accordance with example embodiments of the disclosure.

FIG. 7 shows an example block diagram of a polar code decoding structure 700 in accordance with example embodiments of the disclosure. The polar code decoding structure 700 may implement a multistage decoding technique. The polar code decoding structure 700 may receive noisy output Y. The noisy output Y may be divided into two or more partitioned data units (e.g., y(1), y(2), y(3), through y(m)). The polar code decoding structure 700 may include two or more decoders (e.g., 700a, 700b, 700c, through 700n). The decoder 700a may receive the two or more partitioned data units (e.g., y(1), y(2), y(3), through y(m)) and decode the partitioned data units using a suitable decoding algorithm. The decoder 700b may receive a first subset of the partitioned data units (e.g., y(2), y(3), through y(m)), and decode the partitioned data units using a suitable decoding algorithm. The decoder 700c may receive a second subset of the partitioned data units (e.g., y(3), through y(m)), and decode the partitioned data units using a suitable decoding algorithm. The decoder 700n may receive the partitioned data unit y(m), and decode the partitioned data unit y(m) using a suitable decoding algorithm. The two or more decoders (e.g., 700a, 700b, 700c, through 700n) may output corresponding decoded partitioned data units (e.g., $\hat{u}^{(1)}$, $\hat{u}^{(1)}$, $\hat{u}^{(1)}$ through $\hat{u}^{(1)}$).

Figure 8A:
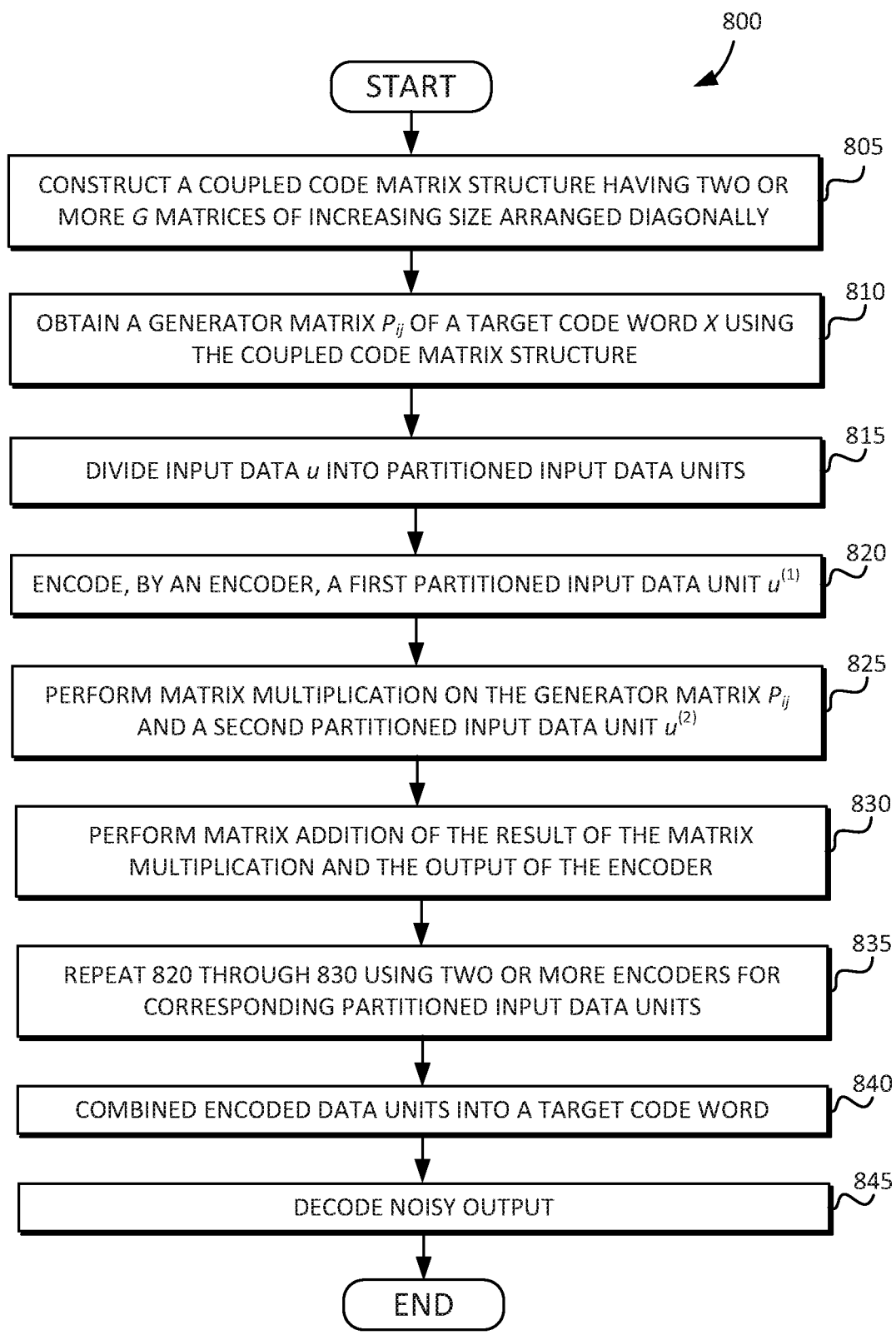
FIG. 8A shows a flow diagram including a technique for performing error correction on length-compatible polar codes for memory systems in accordance with example embodiments of the disclosure.

FIG. 8A shows a flow diagram 800 including a technique for performing error correction on length-compatible polar codes for memory systems in accordance with example embodiments of the disclosure. At 805, a coupled code matrix structure (e.g., 400) can be constructed having two or more G matrices of increasing size arranged diagonally. At 810, a generator matrix $P_{ij}$ of a target code word X may be obtained using the coupled code matrix structure (e.g., 400). At 815, input data u may be divided into partitioned input data units (e.g., $u^{(1)}$, $u^{(2)}$, $u^{(3)}$, through $u^{(m)}$). At 820, an encoder (e.g., 320a) may encode a first partitioned input data unit $u^{(1)}$. At 825, a matrix multiplier unit (e.g., 330) may perform a matrix multiplication on the generator matrix $P_{ij}$ and a second partitioned input data unit $u^{(2)}$. At 830, a matrix adder unit (e.g., 335) may add (e.g., XOR) the result of the matrix multiplication and the output of the encoder (e.g., 320a). At 835, steps 820 through 830 may be repeated using two or more encoders for corresponding partitioned input data units (e.g., $u^{(1)}$, $u^{(2)}$, $u^{(3)}$, through $u^{(m)}$) as described in detail above. At 840, encoded data units (e.g., $x^{(1)}$, $x^{(2)}$, $x^{(3)}$, through $x^{(m)}$) may be combined into a target code word X. At 845, a polar code decoding structure (e.g., 700) may decode noisy output (e.g., Y). It will be understood that the steps illustrated in FIG. 8A may be performed in any suitable order, and/or with or without intervening steps.

Figure 8B:
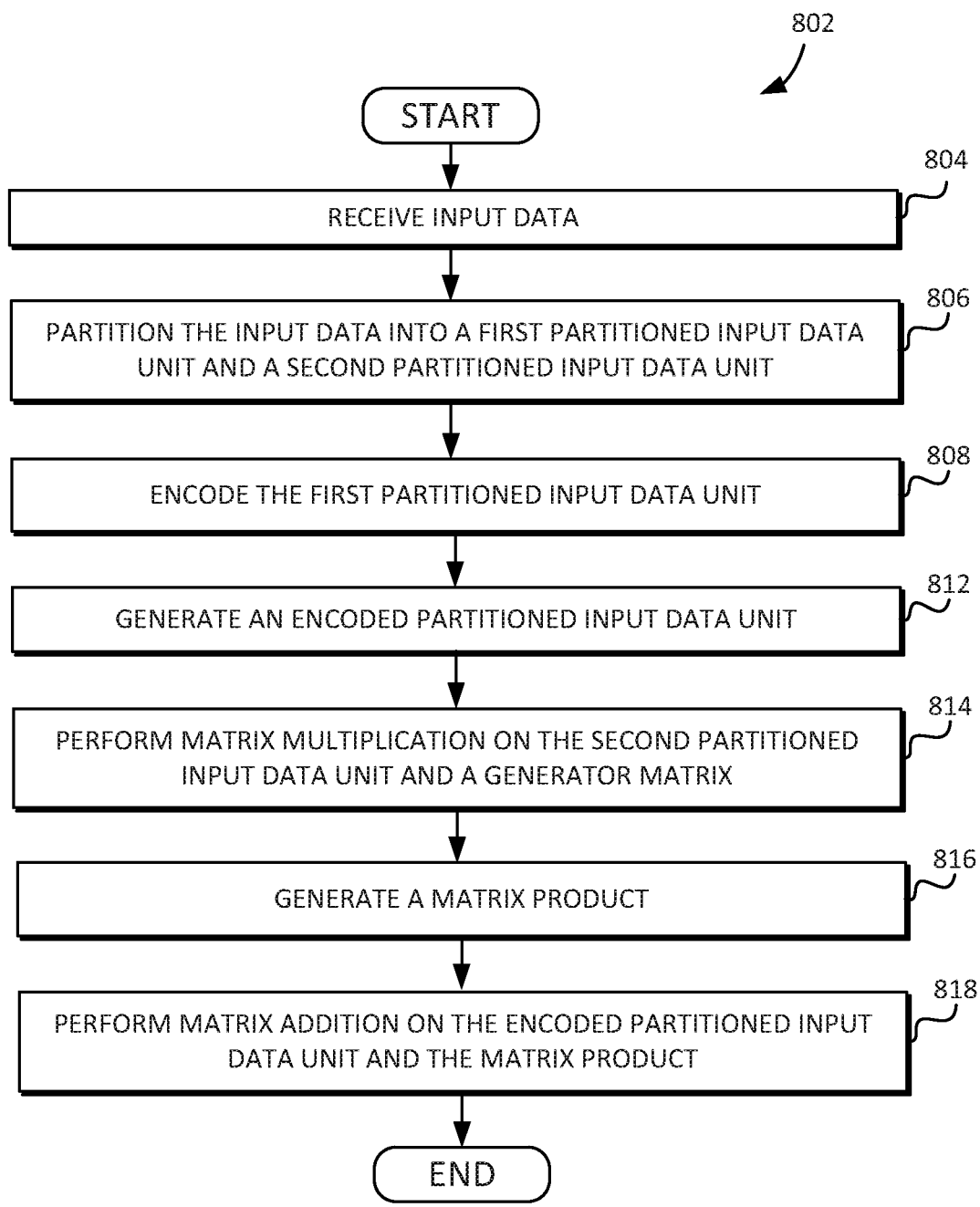
FIG. 8B shows a flow diagram including another technique for performing error correction on length-compatible polar codes for memory systems in accordance with example embodiments of the disclosure.

FIG. 8B shows a flow diagram 802 including another technique for performing error correction on length-compatible polar codes for memory systems in accordance with example embodiments of the disclosure. At 804, a partitioning unit may receive input data. At 806, the partitioning unit may partition the input data into a first partitioned input data unit and a second partitioned input data unit. At 808, an encoder may encode the first partitioned input data unit. At 812, the encoder may generate an encoded partitioned input data unit. At 814, a multiplier unit may perform matrix multiplication on the second partitioned input data unit and a generator matrix. At 816, the multiplier unit may generate a matrix product. At 818, an adder unit may perform matrix addition on the encoded partitioned input data unit and the matrix product. It will be understood that the steps illustrated in FIG. 8B may be performed in any suitable order, and/or with or without intervening steps.

Figure 9:
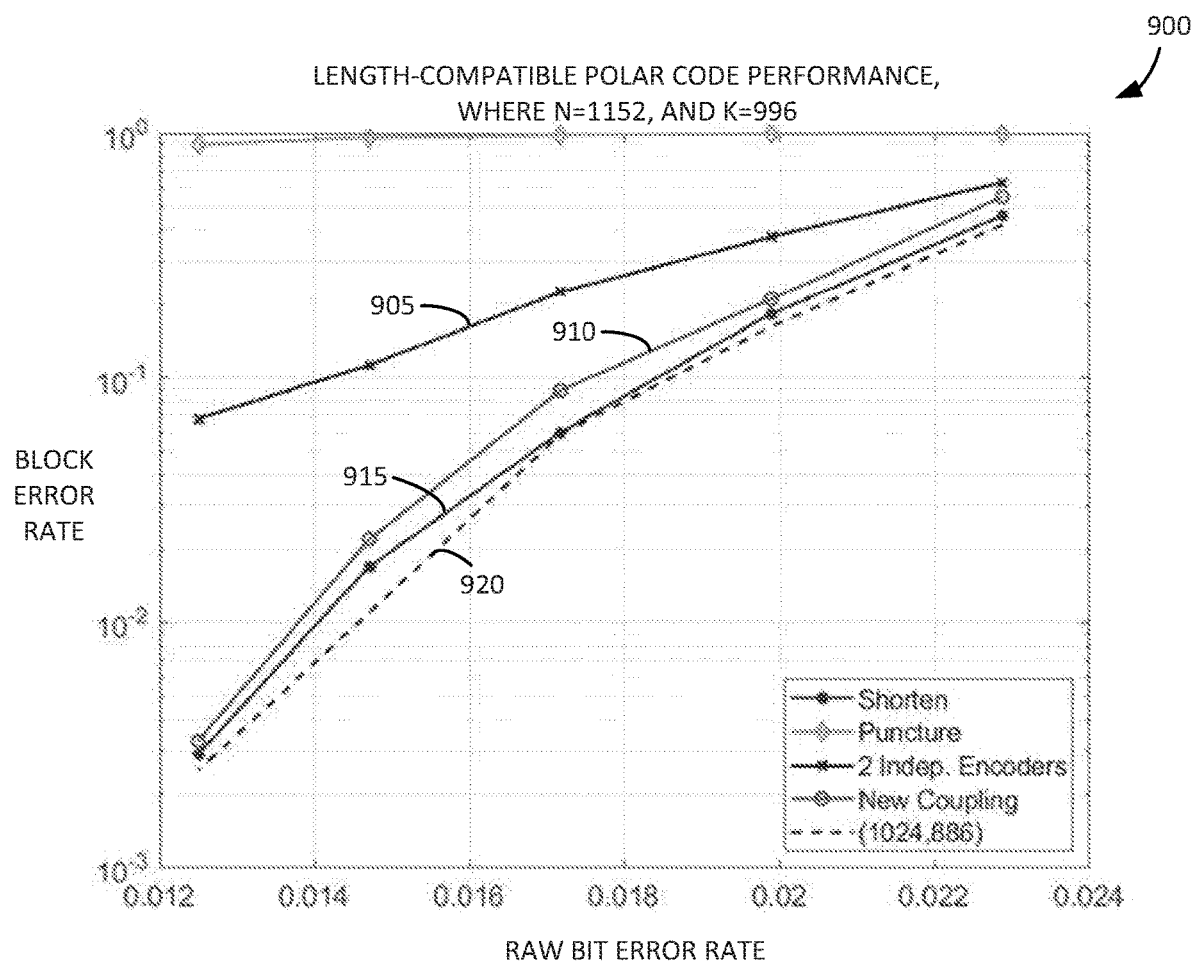
FIG. 9 shows an example block diagram of a graph showing length-compatible polar code performance in accordance with example embodiments of the disclosure.

FIG. 9 shows an example block diagram of a graph 900 showing length-compatible polar code performance, where N=1152, and K=996, in accordance with example embodiments of the disclosure. The higher the data point on the graph 900, the worse the performance. The y-axis shows block error rate. The x-axis shows raw bit error rate. The graph 900 shows various curves (e.g., 905, 910, 915, and 920). Some curves (e.g., 905, 910) have higher data points and therefore worse performance. The curve 915 shows the performance using some embodiments disclosed herein. The curve 920 shows the performance for a benchmark for standard protocols. As can be seen by the graph 900, the curve 915 showing the performance using embodiments disclosed herein is similar to the curve 920 showing the performance for the benchmark, but with about half the complexity of conventional techniques.

Figure 10:
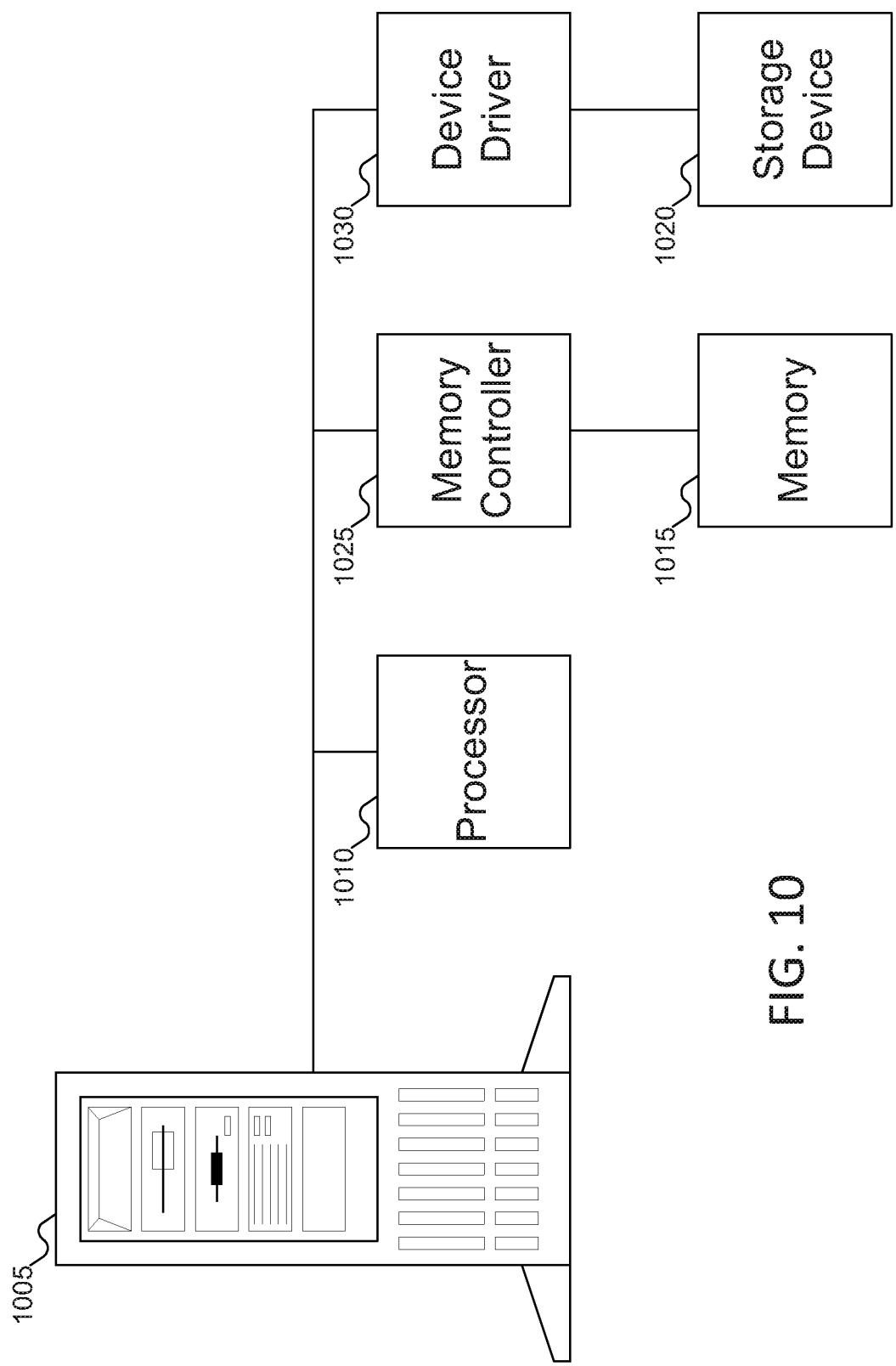
FIG. 10 shows an example block diagram of a system including a computing device in accordance with example embodiments of the disclosure.

FIG. 10 shows an example block diagram of a system including a computing device 1005 in accordance with example embodiments of the disclosure. The computing device 1005 can include a processor 1010, a memory 1015, a memory controller 1025, a storage device 102, and/or a device driver 1030. The example embodiments disclosed herein can be incorporated into any suitable type of memory device 1015. For example, example embodiments disclosed herein can be incorporated into volatile memory devices such as random-access memory (RAM), static RAM (SRAM), dynamic RAM (DRAM), advanced RAM (ARAM), or the like. By way of another example, example embodiments disclosed herein can be incorporated into non-volatile memory devices such as flash memory, SSDs, phase-change memory (PRAM), read only memory (ROM), electrically programmable ROM (EPROM), electrically erasable programmable ROM (EEPROM), registers, or the like. Such memory devices may be incorporated into computing devices such as personal computers, laptops, smart tablets, mobile phones, smart phones, or the like.

Figure 11:
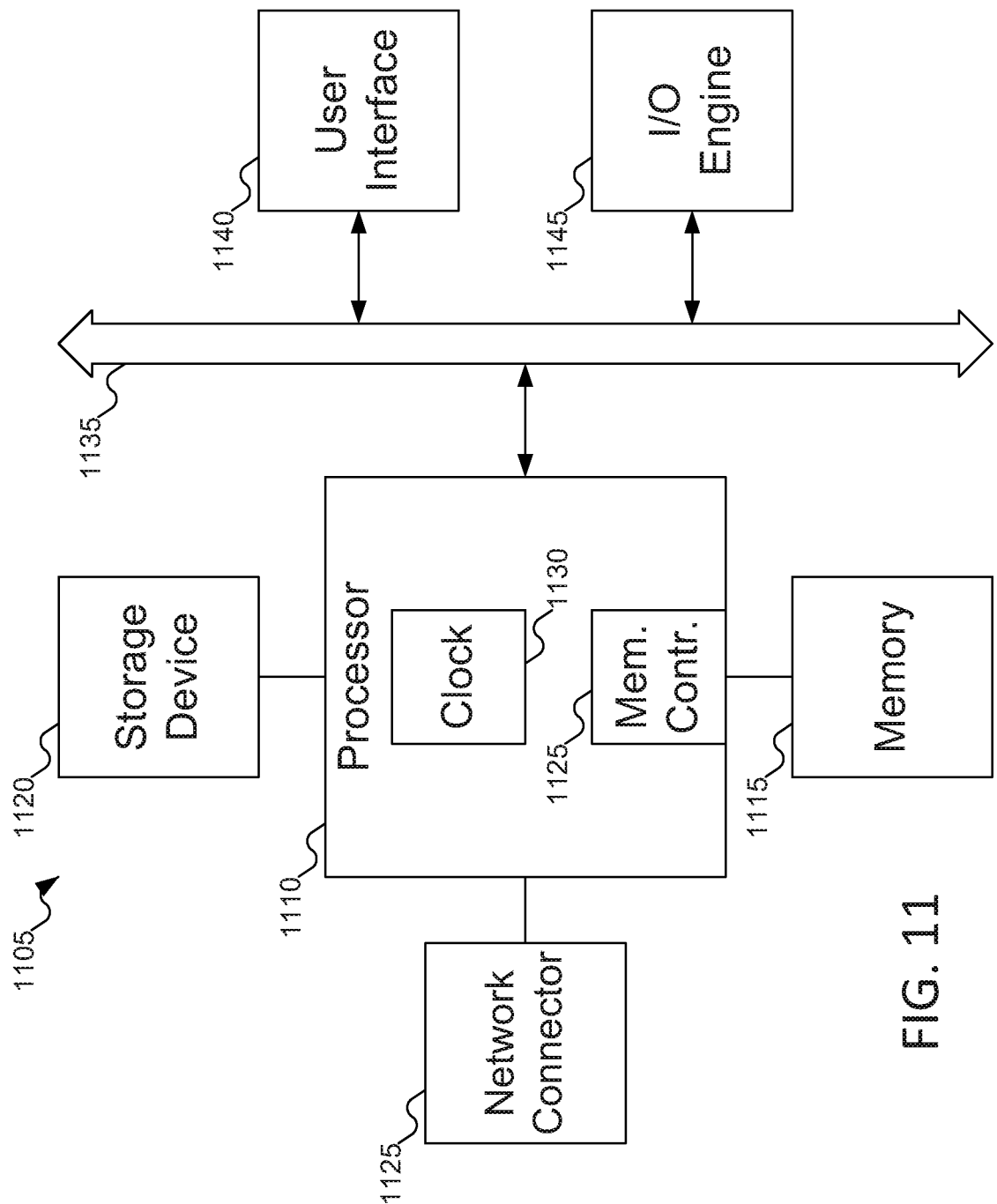
FIG. 11 shows an example block diagram of a system including a processor having a memory controller, a storage device, and a memory in accordance with example embodiments of the disclosure.

FIG. 11 shows an example block diagram of a system 1105 including a processor 1110 having a memory controller 1125 and a clock 1130 in accordance with example embodiments of the disclosure. The processor 1110 may interface with a network via a network connector 1125. The processor 1110 may be connected to a storage device 1120 and/or a memory device 1115. The example embodiments disclosed herein can be incorporated into any suitable type of memory device 1115. The processor 1110 may interact with a user interface 1140 and/or an input/output (I/O) engine 1145 via a communication bus 1135.

Figure 12:
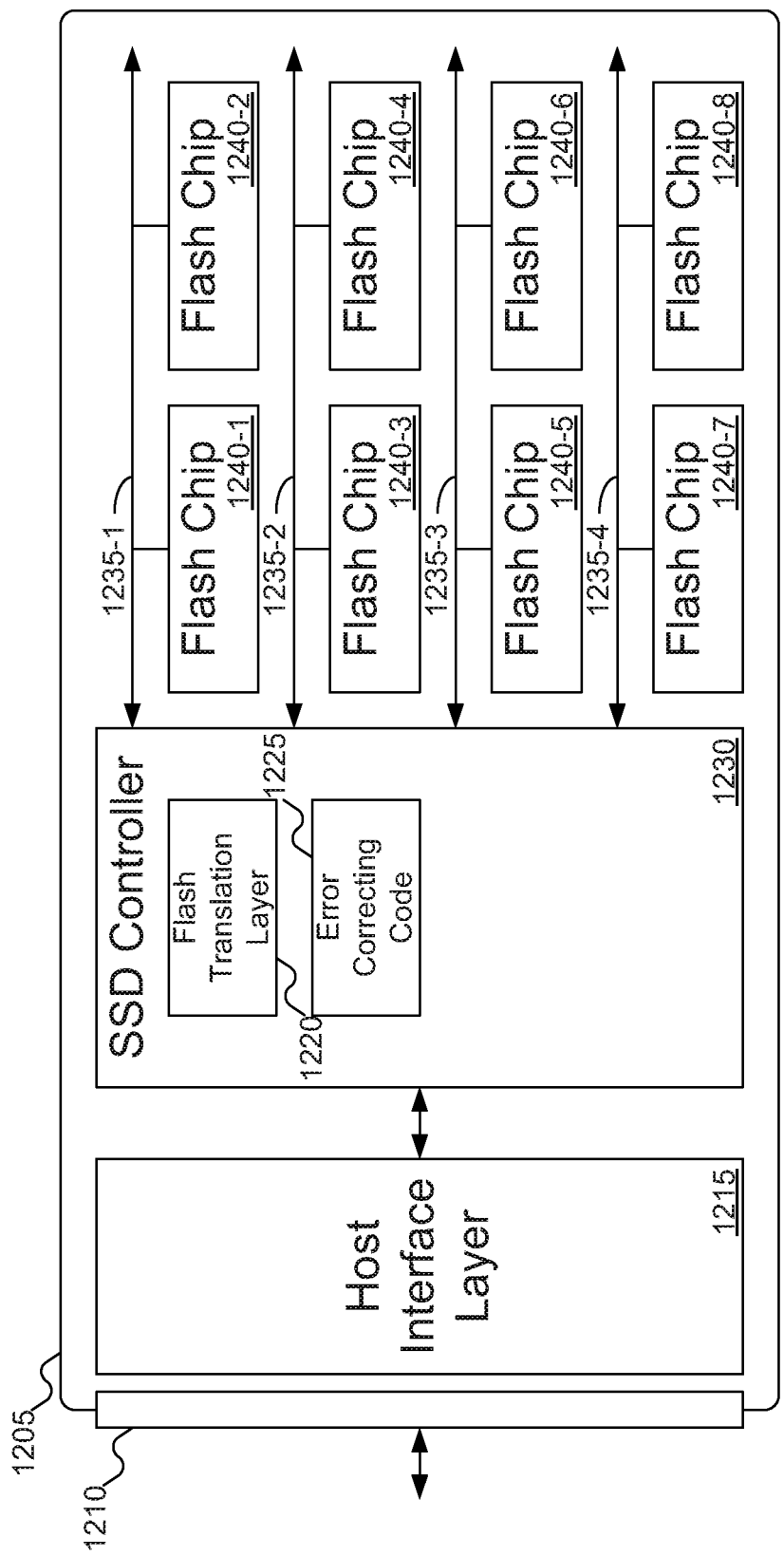
FIG. 12 shows an example block diagram of a system including a board having a solid state drive (SSD) controller and flash memory chips in accordance with example embodiments of the disclosure.

FIG. 12 shows an example block diagram of a system including a board 1205 having an SSD controller 1230 and flash memory chips (e.g., 1240-1 through 1240-8) in accordance with example embodiments of the disclosure. The board may include a port 1210 and a host interface layer 1215. The SSD controller 1230 may include a flash translation layer 1220 and/or error correcting code 1225. The flash memory chips (e.g., 1240-1 through 1240-8) may be connected to the SSD controller 1230 via busses (e.g., 1235-1 through 1235-4). The example embodiments disclosed herein can be incorporated into any suitable type of flash memory chips (e.g., 1240-1 through 1240-8).

The various operations of methods described above may be performed by any suitable means capable of performing the operations, such as various hardware and/or software component(s), circuits, and/or module(s).

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in RAM, flash memory, ROM, EPROM, EEPROM, registers, hard disk, a removable disk, a CD ROM, or any other form of storage medium known in the art.

The following discussion is intended to provide a brief, general description of a suitable machine or machines in which certain aspects of the inventive concept can be implemented. Typically, the machine or machines include a system bus to which is attached processors, memory, e.g., RAM, ROM, or other state preserving medium, storage devices, a video interface, and input/output interface ports. The machine or machines can be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, a virtual machine, or a system of communicatively coupled machines, virtual machines, or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine or machines can include embedded controllers, such as programmable or non-programmable logic devices or arrays, Application Specific Integrated Circuits (ASICs), embedded computers, smart cards, and the like.

The machine or machines can utilize one or more connections to one or more remote machines, such as through a network interface, modem, or other communicative coupling. Machines can be interconnected by way of a physical and/or logical network, such as an intranet, the Internet, local area networks, wide area networks, etc. One skilled in the art will appreciate that network communication can utilize various wired and/or wireless short range or long range carriers and protocols, including radio frequency (RF), satellite, microwave, Institute of Electrical and Electronics Engineers (IEEE) 545.11, Bluetooth®, optical, infrared, cable, laser, etc.

Embodiments of the present disclosure can be described by reference to or in conjunction with associated data including functions, procedures, data structures, application programs, etc. which when accessed by a machine results in the machine performing tasks or defining abstract data types or low-level hardware contexts. Associated data can be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data can be delivered over transmission environments, including the physical and/or logical network, in the form of packets, serial data, parallel data, propagated signals, etc., and can be used in a compressed or encrypted format. Associated data can be used in a distributed environment, and stored locally and/or remotely for machine access.

Having described and illustrated the principles of the present disclosure with reference to illustrated embodiments, it will be recognized that the illustrated embodiments can be modified in arrangement and detail without departing from such principles, and can be combined in any desired manner. And although the foregoing discussion has focused on particular embodiments, other configurations are contemplated. In particular, even though expressions such as "according to an embodiment of the inventive concept" or the like are used herein, these phrases are meant to generally reference embodiment possibilities, and are not intended to limit the inventive concept to particular embodiment configurations. As used herein, these terms can reference the same or different embodiments that are combinable into other embodiments.

Embodiments of the present disclosure may include a non-transitory machine-readable medium comprising instructions executable by one or more processors, the instructions comprising instructions to perform the elements of the inventive concepts as described herein.

The foregoing illustrative embodiments are not to be construed as limiting the inventive concept thereof. Although a few embodiments have been described, those skilled in the art will readily appreciate that many modifications are possible to those embodiments without materially departing from the novel teachings and advantages of the present disclosure. Accordingly, all such modifications are intended to be included within the scope of this present disclosure as defined in the claims.

What is claimed is:

1. A polar code encoding system, comprising:
a processor coupled to a memory device configured to process one or more polar codes and to improve an error rate of the polar codes, the memory device including:
a partitioning unit configured to receive input data, and to partition the input data into a first partitioned input data unit and a second partitioned input data unit;
an encoder configured to encode the first partitioned input data unit, and to generate an encoded partitioned input data unit;
a multiplier unit configured to perform matrix multiplication on the second partitioned input data unit and a generator matrix, and to generate a matrix product; and
an adder unit configured to perform matrix addition on the encoded partitioned input data unit and the matrix product, and to provide an encoded data unit.

2. The system of claim 1, wherein the encoder is a first encoder, the multiplier unit is a first multiplier unit, the adder unit is a first adder unit, the generator matrix is a first generator matrix, the encoded partitioned input data unit is a first encoded partitioned input data unit, and the system further comprises:
a second encoder configured to encode the second partitioned input data unit, and to generate a second encoded partitioned input data unit;
a second multiplier unit configured to perform matrix multiplication on a third partitioned input data unit and a second generator matrix, and to generate a second matrix product; and
a second adder unit configured to perform matrix addition on the first encoded partitioned input data unit and the second matrix product.

3. The system of claim 2, further comprising:
a third multiplier unit configured to perform matrix multiplication on the third partitioned input data unit and a third generator matrix, and to generate a third matrix product; and
a third adder unit configured to perform matrix addition on the second encoded partitioned input data unit and the third matrix product.

4. The system of claim 3, further comprising:
a third encoder configured to encode the third partitioned input data unit, and to generate a third encoded partitioned input data unit;
a fourth multiplier unit configured to perform matrix multiplication on an mth partitioned input data unit and a fourth generator matrix, and to generate a fourth matrix product;
a fourth adder unit configured to perform matrix addition on the first encoded partitioned input data unit and the fourth matrix product;
a fifth multiplier unit configured to perform matrix multiplication on the mth partitioned input data unit and a fifth generator matrix, and to generate a fifth matrix product;
a fifth adder unit configured to perform matrix addition on the second encoded partitioned input data unit and the fifth matrix product;
a sixth multiplier unit configured to perform matrix multiplication on the mth partitioned input data unit and a sixth generator matrix, and to generate a sixth matrix product; and
a sixth adder unit configured to perform matrix addition on the third encoded partitioned input data unit and the sixth matrix product.

5. The system of claim 4, further comprising an nth encoder configured to encode the mth partitioned input data unit, and to generate an mth encoded partitioned input data unit.

6. The system of claim 5, further comprising a combining unit configured to combine outputs of the first encoder, the second encoder, the third encoder, and the nth encoder into a target code word X.

7. The system of claim 6, wherein the target code word X is a length-compatible code word.

8. The system of claim 4, wherein:
the first multiplier unit, the second multiplier unit, the third multiplier unit, the fourth multiplier unit, the fifth multiplier unit, and the sixth multiplier unit are a single, same multiplier unit; and
the first adder unit, the second adder unit, the third adder unit, the fourth adder unit, the fifth adder unit, and the sixth adder unit are a single, same adder unit.

9. The system of claim 1, wherein the generator matrix is a sub-matrix of a coupled code matrix structure including two or more G matrices of increasing size arranged diagonally.

10. A method for processing length-compatible polar codes for memory systems, the method comprising:
processing, by a memory device, one or more length-compatible polar codes to improve an error rate of the length-compatible polar codes;
constructing, by the memory device, a coupled code matrix structure including two or more G matrices of increasing size arranged diagonally;
obtaining, by the memory device, a generator matrix Pij of a target code word X using the coupled code matrix structure;
dividing, by the memory device, input data into a first partitioned input data unit and a second partitioned input data unit;
encoding, by an encoder, the first partitioned input data unit to generate an encoded partitioned input data unit;
performing, by a multiplier unit, a matrix multiplication on the generator matrix Pij and the second partitioned input data unit, to generate a product matrix;
performing, by an adder unit, a matrix addition on the product matrix and the encoded partitioned input data unit; and
providing, by the adder unit, an encoded data unit.

11. The method of claim 10, further comprising, combining an output of the adder unit into the target code word X.

12. A method for processing length-compatible polar codes for memory systems, the method comprising:
processing, by a memory device, one or more polar codes to improve an error rate of the polar codes;
receiving, by a partitioning unit of the memory device, input data;
partitioning the input data, by the partitioning unit, into a first partitioned input data unit and a second partitioned input data unit;
encoding, by an encoder, the first partitioned input data unit;
generating, by the encoder, an encoded partitioned input data unit;
performing matrix multiplication, by a multiplier unit, on the second partitioned input data unit and a generator matrix;
generating, by the multiplier unit, a matrix product;
performing, by an adder unit, matrix addition on the encoded partitioned input data unit and the matrix product; and
providing, by the adder unit, an encoded data unit.

13. The method of claim 12, wherein the encoder is a first encoder, the multiplier unit is a first multiplier unit, the adder unit is a first adder unit, the generator matrix is a first generator matrix, the encoded partitioned input data unit is a first encoded partitioned input data unit, and the method further comprises:

encoding, by a second encoder, the second partitioned input data unit;
generating, by the second encoder, a second encoded partitioned input data unit;
performing, by a second multiplier unit, matrix multiplication on a third partitioned input data unit and a second generator matrix;
generating, by the second multiplier unit, a second matrix product; and
performing, by a second adder unit, matrix addition on the first encoded partitioned input data unit and the second matrix product.

14. The method of claim 13, further comprising:
performing, by a third multiplier unit, matrix multiplication on the third partitioned input data unit and a third generator matrix;
generating, by the third multiplier unit, a third matrix product; and
performing, by a third adder unit, matrix addition on the second encoded partitioned input data unit and the third matrix product.

15. The method of claim 14, further comprising:
encoding, by a third encoder, the third partitioned input data unit;
generating, by the third encoder, a third encoded partitioned input data unit;
performing, by a fourth multiplier unit, matrix multiplication on an mth partitioned input data unit and a fourth generator matrix;
generating, by the fourth multiplier unit, a fourth matrix product;
performing, by a fourth adder unit, matrix addition on the first encoded partitioned input data unit and the fourth matrix product;
performing, by a fifth multiplier unit, matrix multiplication on the mth partitioned input data unit and a fifth generator matrix;
generating, by the fifth multiplier unit, a fifth matrix product;
performing, by a fifth adder unit, matrix addition on the second encoded partitioned input data unit and the fifth matrix product;
performing, by a sixth multiplier unit, matrix multiplication on the mth partitioned input data unit and a sixth generator matrix;
generating, by the sixth multiplier unit, a sixth matrix product; and
performing, by a sixth adder unit, matrix addition on the third encoded partitioned input data unit and the sixth matrix product.

16. The method of claim 15, further comprising an nth encoder configured to encode the mth partitioned input data unit, and to generate an mth encoded partitioned input data unit.

17. The method of claim 16, further comprising combining, by a combining unit, outputs of the first encoder, the second encoder, the third encoder, and the nth encoder into a target code word X.

18. The method of claim 17, wherein the target code word X is a length-code word X, where N, where N is a power of two (2), and where each of N1, N2, through Nm are a power of two (2).

19. The method of claim 15, wherein:
the first multiplier unit, the second multiplier unit, the third multiplier unit, the fourth multiplier unit, the fifth multiplier unit, and the sixth multiplier unit are a single, same multiplier unit; and the first adder unit, the second adder unit, the third adder unit, the fourth adder unit, the fifth adder unit, and the sixth adder unit are a single, same adder unit.

20. The method of claim 12, wherein the generator matrix is a sub-matrix of a coupled code matrix structure including two or more G matrices of increasing size arranged diagonally.

\* \* \* \* \*